3 Sheets-Sheet 3

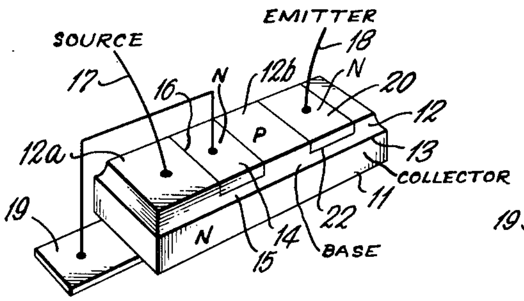
Fig. 2a
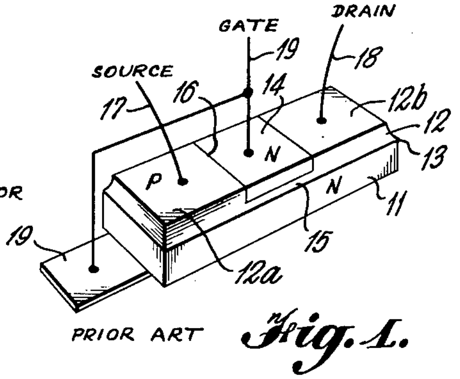
PRIOR ART Fig. 1.
Fig. 2c
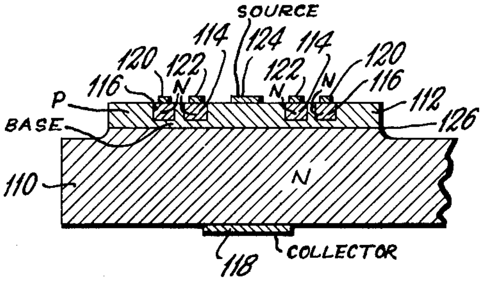
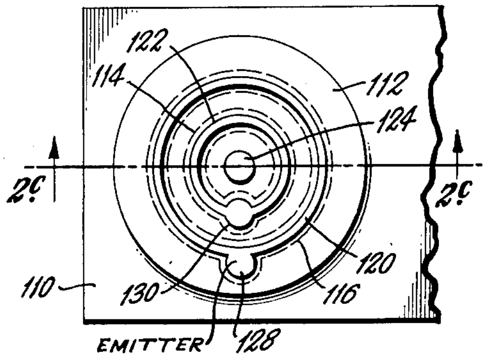
Fig. 2b
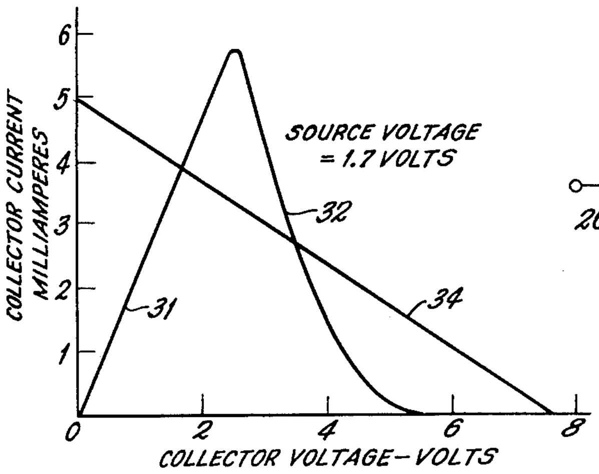
Fig. 4.
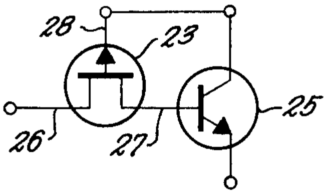
Fig. 3.
INVENTORS
Arthur D. Evans &
Robert A. Meadows
BY John G. Graham
ATTORNEY INVENTORS
Arthur D. Evans &
Robert A. Meadows
BY John D. Graham
ATTORNEY INTEGRATED STRUCTURE SEMICONDUCTOR NETWORK FORMING BIPOLAR FIELD EFFECT TRANSISTOR Original Filed May 2, 1960

INVENTORS
Arthur D. Evans &
Robert A. Meadows

BY John G. Graham
ATTORNEY

United States Patent Office 3,230,398

Patented Jan. 18, 1966

3,230,398

INTEGRATED STRUCTURE SEMICONDUCTOR NETWORK FORMING BIPOLAR FIELD EFFECT TRANSISTOR

Arthur D. Evans, Saratoga, Calif., and Robert A. Meadows, Richardson, Tex., assignors to Texas Instruments Incorporated, Dallas, Tex., a corporation of Delaware Continuation of application Ser. No. 26,126, May 2, 1960. This application Mar. 31, 1964, Ser. No. 356,181
4 Claims. (Cl. 307—88.5)

The present invention relates to solid-state semiconductor networks and more particularly to a solid-state semiconductor network which functions as a ring counter.

This application is a continuation of our copending application Serial No. 26,126, filed May 2, 1960.

Solid-state semiconductor networks have heretofore been proposed, illustrative of which are those disclosed in the application of Jack S. Kilby, Serial No. 719,602, filed February 6, 1959, and entitled, "Miniaturized Electronic Circuits and Method of Making." According to that application, entire electronic networks are fabricated entirely within tiny wafers of semiconductor material, for various portions of the material act as discrete circuit elements, and other portions of the material act to connect internally certain of the circuit elements as required.

Although the subject matter of the kilby application constitutes a major breakthrough in the art of circuit miniaturization, and although through its practice any of a wide variety of electronic networks can be formed within a single tiny wafer of semiconductor material, problems have arisen with respect to some types of circuits and circuit elements.

The present invention comprises a ring counter embodied in semiconductor network form. The ring counter of the present invention utilizes a bipolar field-effect device as the basic active element. This bipolar field-effect device is described in the copending application Serial No. 26,134 of Arthur D. Evans, filed May 2, 1960.

The bipolar field-effect device mentioned above is particularly advantageous for use in bistable circuits because of its very high input impedance when turning ON or OFF. The high input impedance also reduces the amount of trigger power required and allows many more stages to be driven by any one stage. Another very important advantage occurring from the high input impedance of the device is that much less complicated circuitry may be used and the associated resistors and capacitors required to complete the circuit may be of relatively low value.

Needless to say, the last two mentioned advantages are exceedingly important in semiconductor networks, both from the production and the reliability standpoint. In the manufacture of semiconductor networks, it is necessary to shape a wafer of single-crystal semiconductor material by etching, diffusion of impurities, and other means to form areas within the wafer which function as discrete circuit elements. The fewer the number of regions which it is necessary to create, the better the chance of obtaining a complete network which will operate in a satisfactory manner. This also greatly lessens the possibility that one portion of the circuit will fail sometime during operation of the circuit, thereby requiring replacement of the entire network.

In fabricating semiconductor networks, it is difficult to form regions having a high value of resistance, and relatively large surface areas are required to form regions which exhibit high capacitance. As the high-input impedance of the bipolar field-effect device allows the use of relative low values of resistance in capacitance, the semiconductor network can be reduced in size and, in some cases, semiconductor networks can be fabricated, but would otherwise not be practical.

It is therefore one object of the present invention to provide a semiconductor network which functions as a ring counter.

Another object of the present invention is to provide a semiconductor network which utilizes a bipolar field-effect device in a ring counter.

These and other objects and advantages of the present invention become more apparent as the following detailed description unfolds when taken in conjunction with the following figures in which:

FIGURE 1 is a perspective view of a unipolar field-effect device;

FIGURE 2*a* is a perspective view of a bipolar field-effect device;

FIGURE 2*b* is a plan view of the preferred embodiment of the bipolar field-effect device incorporated into semiconductor networks;

FIGURE 2*c* is a view in cross section of the device of FIGURE 2*b*;

FIGURE 3 is a schematic illustration showing the equivalent circuit of the device of FIGURE 2*b*;

FIGURE 4 is a graph showing the current-voltage characteristics of the device of FIGURE 2*b*;

Figure 6:
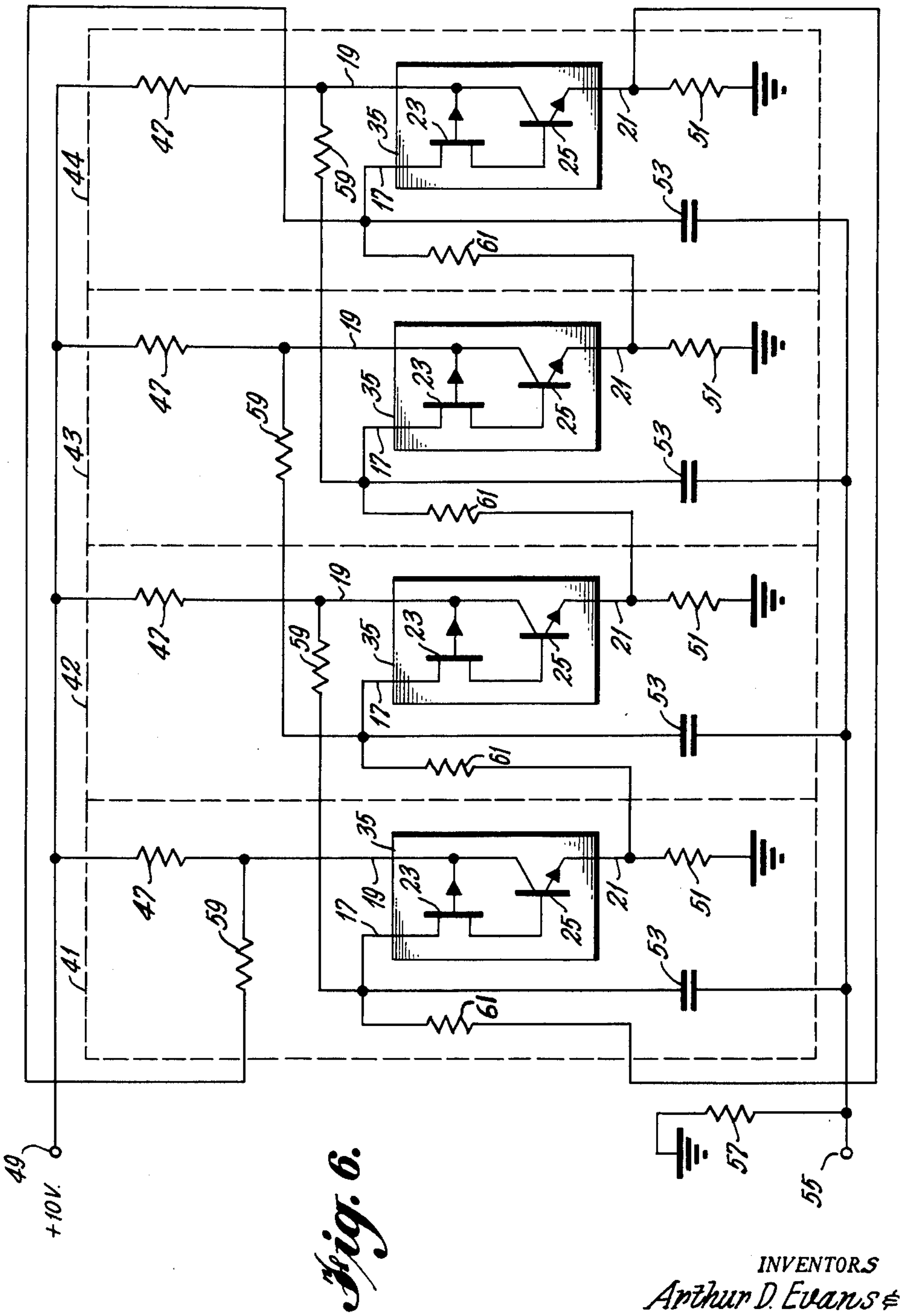
FIGURE 6 is a schematic illustration of electrical equivalent of the semiconductor network of the present invention.

The present invention makes use of a bipolar field-effect transistor which is a modification of a unipolar field-effect transistor such as that illustrated in FIGURE 1. The unipolar field-effect transistor in FIGURE 1 comprises a block 11 of N-type material in which is formed a diffused layer 12 of P-type material forming a PN junction 13 with the N-type material of the block 11. In the middle of the layer 12 of P-type material is a diffused section 14 of N-type material which extends down into the layer 12 of P-type material, dividing it into two main parts **12*a* and 12*b* connected by a narrow conducting channel 15 of P-type material bounded by the N-type material of block 11 and the section 14 of N-type material. The section 14 of N-type material makes a PN junction 16 with the layer 12 of P-type material. An ohmic connection is made to one of the main parts 12*a* of the layer 12 of P-type material. This connection provides the source 17 of the field-effect transistor. An ohmic connection is made to the other main part 12*b* of the layer 12 of P-type material to provide the drain 18 of the field-effect transistor. Ohmic connections are also made to the section 14 and to the block 11 on the side opposite to the layer 12, which connections are connected together to form the gate 19** of the field-effect transistor.

The width of the channel 15 between the boundaries provided by the PN junctions 13 and 16 is important in determining the characteristics of the field-effect transistor. This width is controlled and determined by the depths of diffusion of the layer 12 and the section 14. With this structure, the conductance in the channel 15 of P-type material between the source 17 and the drain 18 is controlled by the voltage applied to the gate 19.

FIGURE 2*a* illustrates a bipolar field-effect transistor of the type which is used in the circuit of the present invention. As shown in FIGURE 2*a*, the bipolar field-effect transistor, like the unipolar field-effect transistor illustrated in FIGURE 1, comprises a block 11 of N-type material on which there is a diffused layer 12 of P-type material. In the layer 12 is a diffused section 14 of N-type material. The N-type material of the block 11 forms a PN junction 13 with the layer 12 of P-type material. The section 14 of N-type material also forms a PN junction 16 with the layer 12 of P-type material. As in the unipolar transistor, the section 14 extends into the layer 12, dividing it into two major parts 12*a* and 12*b* connected by a narrow channel 15 of P-type material. An ohmic contact is made with the part 12*a* of the layer 12 to form the source 17 of the bipolar field-effect transistor. Ohmic contacts are made to the section 14 and to the block 11 on the side opposite the layer 12, which contacts are connected together to form an electrode 19 of the bipolar field-effect transistor. The electrode 19 in the bipolar field-effect transistor is structurally the same as the gate 19 in the unipolar field-effect transistor. In the bipolar field-effect transistor, however, this electrode is referred to as the collector. As can be seen in FIGURE 2, the bipolar field-effect transistor differs from the unipolar field-effect transistor in that a diffused section 20 of N-type material is provided in the part 12*b* of the layer 12 of P-type material. This section 20 of N-type material extends down into the layer 12 of P-type material not quite as far as the junction 13. An ohmic contact is made to the section 20 forming the emitter 18 of the bipolar field-effect transistor. The section 20 forms a PN junction 22 with the P-type material of the layer 12. The PN junctions 22 and 13 will coact to provide junction transistor action and, as a result, the bipolar field-effect transistor will function as a junction transistor and unipolar field-effect transistor connected together in a circuit, which is shown in FIGURE 3.

FIGURES 2*b* and 2*c* show a particular physical embodiment of the bipolar field-effect transistor of FIGURE2*a* which has been found to be especially desirable. A specific example of a method of producing this structure will now be detscribed. A wafer 110 of silicon of a resistivity of 7.5 ohm-centimeters is used as the starting material. Each side of the wafer is lapped to achieve wafer thickness of 10 mils. The upper side of the wafer is then optically polished. After the polishing operation, the wafer is placed in an open tube, and steam of a temperature of approximately 1200° C. is allowed to pass over the wafer. This operation causes a thin oxide film to form on all surfaces of the wafer. The wafer is then subjected to diffusion from a gallium trioxide source in the presence of dry oxygen to form a layer of P-type material approximately 0.7 mil thick in the surface of the wafer. Using photoresist technique, the oxide film is then selectively removed from concentric circular portions of the wafer surface. After the selective removal of the oxide film, the wafer is subjected to a second diffusion cycle in which phosphorus is diffused to a depth of approximately 0.3 mil from a phosphorous pentoxide source in the presence of dry nitrogen. The resulting thin layer of P-type material is then removed from the bottom and sides of the wafer, leaving a layer 112 of P-type material on the surface of the wafer, making a PN junction 126 with the N-type material of the wafer. The second step of diffusion from the source of phosphorus pentoxide causes concentric circular sections 114 and 116 of N-type material to be formed in the layer 12 making PN junctions with the P-type material of the layer 12. Ohmic contacts 120 and 122 to the sections 116 and 114, respectively, are provided. An ohmic contact 124 to the layer 112 is provided at the center about which the circular sections 114 and 116 are positioned. An ohmic contact 118 is provided to the bottom of the wafer 110. The contacts 118, 120, 122 and 124 are of aluminum, and are formed by evaporation and sintering techniques. The wafer is then masked with an etch-resistant material such as wax, and the wafer etched in an acid solution to achieve the mesa configuration shown in FIGURE 2*c*.

The resulting device is a bipolar field-effect transistor which is equivalent to the device in FIGURE 2*a*. In the device in FIGURES 2*b* and 2*c*, the contacts 124 and 120 correspond to the source 17 and the emitter 21, respectively, in FIGURE 2*a*. The contacts 122 and 118 in FIGURES 2*b* and 2*c* will be connected together and correspond to the collector 19 in FIGURE 2*a*. The sections 114 and 116 in FIGURES 2*b* and 2*c* correspond to the sections 14 and 20, respectively, in FIGURE 2*a*.

It is to be noted that, in some instances, it may be desirable that the sections 114 and 116 be diffused to different depths or have different impurity concentrations therein. In such instances, it will be necessary to form the sections by different diffusion cycles. In the preferred embodiment, however, only one diffusion cycle is used to form both sections 114 and 116.

The circuit in FIGURE 3 is the equivalent circuit of the bipolar field-effect transistor. As shown in FIGURE 3, the equivalent circuit comprises a unipolar field-effect transistor 23 and a junction transistor 25, which in the specific embodiment of the present invention is an NPN transistor. In FIGURE 3, the source of the unipolar field-effect transistor 23 is designated by the reference number 26, the gate by the reference number 28, and the drain by the reference number 27. The unipolar field-effect transistor 23 has its drain connected directly to the base of the junction transistor 25. The gate of the field-effect transistor 23 is connected directly to the collector of the junction transistor 25. The source of the bipolar field-effect transistor corresponds in its equivalent circuit to the source 26 of the unipolar field-effect transistor 23. The collector of the bipolar field-effect transistor corresponds in its equivalent circuit to the common connection between the gate 28 of the unipolar field-effect transistor 23 and the collector of the junction transistor 25. The emitter of the bipolar field-effect transistor corresponds in its equivalent circuit to the emitter of the junction transistor 25.

A collector voltage versus collector current characteristic for the bipolar field-effect transistor and for its equivalent circuit is shown in FIGURE 4. This characteristic is for a constant source voltage of 1.7 volts. This characteristic, as seen in FIGURE 4, has a positive resistance portion 31 and a negative resistance portion 32. The negative resistance portion of the characteristic arises when the junction transistor 25 is not in saturation. As the collector voltage rises, the voltage applied to the gate of the unipolar field-effect transistor 23 will rise, and this will decrease the drain current flowing from the field-effect transistor 23. In this manner, the base curent flowing to the junction transistor 25 is decreased, and this decrease in base current will cause a decrease in the collector current. Thus, as the collector voltage is increased, the collector current of the transistor 25 will decrease, thus providing the negative resistance portion of the characteristic. The positive resistance portion of the characteristic occurs during the time that the junction transistor 25 is saturated. At low values of collector voltage, the drain current of the field-effect transistor 23 will be high, and thus the base current of the transistor 25 will be high enough to cause the transistor 25 to saturate. As the collector voltage is increased, it will decrease the current flowing from the drain of the field-effect transistor 23. However, since the transistor 25 is in saturation, this will have not effect on the collector current of the transistor 25. Therefore, the collector current will increase as the collector voltage increases, thus providing the positive resistance portion 31 of the characteristic shown in FIGURE 4. The point at which the characteristic changes from positive resistance to negative resistance is the point at which transistor 25 comes out of saturation.

From FIGURE 4, it will be seen that the device has bistable properties. For example, the 1500 ohm load line 34, drawn from the point represented by 5 milliamperes and zero volts to the point represented by zero milliamperes and 7.5 volts, crosses the characteristic three times. One crossing is on the positive resistance portion 31 of the characteristic, another crossing is on the negative resistance portion 32, and the third crossing is on the cut-off line at a current of zero milliamperes. Therefore, two stable points are provided, one being on the positive resistance portion where the transistor 25 is in saturation, and the other being on the cut-off line where the field-effect transistor 23 is pinched off and the junction transistor 25 is cut off.

Figure 5:
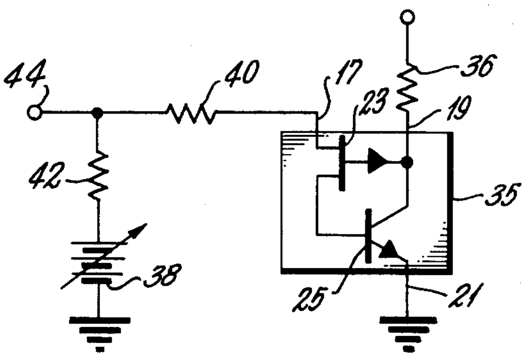
FIGURE 5 is a schematic illustration of a circuit to exemplify the switching properties of the bipolar field-effect device.

FIGURE 5 exemplifies the switching characteristics of the device. In FIGURE 5, the reference number 35 generally designates the bipolar field-effect transistor, in order to facilitate the description of the operation of the device, which is represented by its equivalent circuit comprising the unipolar field-effect transistor 23 and the junction transistor 25. In FIGURE 5, the emitter 21 of the bipolar field-effect transistor 35 is grounded and the collector 19 is connected to a source of positive voltage through a 300 ohm resistor 36. The source 17 of the bipolar field-effect transistor 35 is connected to the positive terminal of a variable voltage source 38 through the series circuit of a 2 kilohm resistor 40 and a 51 ohm resistor 42. The negative terminal of the source 38 is grounded. A terminal 44 is connected to the junction between resistors 40 and 42 to provide an input to the circuit.

If the circuit is in the condition in which the field-effect transistor is pinched off and the junction transistor is cut off, and a positive pulse is applied to the input 44, the voltage at the source 17 will rise at a rate depending on the RC time constant associated with the input resistor 40 and the capacitance from the source 17 to ground. When the voltage at the source 17 starts to rise, the gate-to-source voltage of the field-effect transistor 23 will decrease. When this gate-to-source voltage decreases to a value below the pinch-off voltage for the field-effect transistor 23, the field-effect transistor 23 will start to conduct. When the field-effect transistor starts to conduct, it will supply current to the base of the junction transistor 25. The base current flowing in the junction transistor 25 and the collector voltage of the junction transistor 25 will drop. As a result, the voltage at the gate of the field-effect transistor 23 drops, and more current flows through the field-effect transistor 23. The action is regenerative, and the field-effect transistor and the junction transistor are switched quickly to a fully conducting condition. If the field-effect transistor supplies enough current to the base of the junction transistor, it will saturate, the diode from the gate-to-source of the field-effect transistor 23 will become forward-biased, and the voltage at the source 17 will be clamped to the voltage at the collector 19. The device will remain fully conducting until the voltage at the source 17 is decreased to less than the voltage at the collector 19, at which time the field-effect transistor 23 will start to be pinched off. A regenerative action will come into play to switch the device to a nonconductive condition if the junction transistor acts faster than the field-effect transistor 23. Otherwise, the field-effect transistor will become nonconducting while the junction transistor is still in storage.

It should be noted that, when the junction transistor 25 is saturated, the voltage from the collector to the base of the junction transistor 25 is about zero volts; therefore, the voltage from the source to the drain of the field-effect transistor 23 will be the same approximately as the voltage from the source to the gate, and the field-effect transistor 23 will be in its saturation region. Therefore, the source-to-drain current of the field-effect transistor may be less than its limiting value. If the junction transistor 25 requires the limiting value of drain current as base current to saturate, it will never saturate, and the field-effect transistor 23 will act as a base current clamp to keep the junction transistor 25 out of saturation. Of course, the low-gain junction transistors are the ones that would not saturate. These low-gain devices would be the slowest switching to a fully conducting condition because there would be less loop gain, but they would be cut off faster because of decreased storage time.

The loop gain and the RC circuit of the input resistance 40 and the capacitance from the source 17 to ground determine the rise time of the circuit. The storage and fall time of the circuit depend almost entirely on the storage and fall time of the junction transistor 25.

FIGURE 6 illustrates how the bipolar field-effect transistors are connected in the equivalent electrical circuit for the ring counter which comprises the present invention. In FIGURE 6, the bipolar field-effect transistors are designated generally by the reference number 35, and, in order to facilitate description of the operation of the invention, they are represented by the equivalent circuit shown in FIGURE 3. Thus, each bipolar field-effect transistor 35 is represented by unipolar field-effect transistor 23 and a junction transistor 25 with the drain of the unipolar field-effect transistor 23 connected directly to the base of the junction transistor 25 and with the gate of the unipolar field-effect transistor 23 connected directly to the collector of the junction transistor 25. The connection between the gate of unipolar field-effect transistor 23 and the collector of junction transistor 25 provides the collector 19 for the bipolar field-effect transistor; the source of the unipolar field-effect transistor 23 provides the source 17 of the bipolar field-effect transistor; and the emitter of the junction transistor 25 provides the emitter 21 of the bipolar field-effect transistor.

The ring counter comprises a plurality of identical stages which may be of any number. In the specific embodiment of the present invention, only four stages are shown to simplify the showing in the drawings. These are designated generally by the reference numbers 41, 42, 43, and 44. Each stage of the ring counter comprises a bipolar field-effect transistor 35 which has its collector connected through a 300 ohm resistor 47 to a source of +10 volts common to all three stages applied at a terminal 49. In each stage of the ring counter, the emitter 21 is connected through a 200 ohm resistor 51 to ground. In each stage of the ring counter, a capacitor 53 connects the source 17 of the bipolar field-effect transistor 35 to an input 55 common to all four stages. The input 55 is connected to ground by 51 ohm resistor 57. The collector 19 in each stage is connected through a 1.5 kilohm resistor 59 to the source 17 of the next preceding stage. Thus, a resistor 59 connects the source 17 of the stage 41 to the collector 19 in the stage 42; a resistor 59 connects the source 17 in the stage 42 to the collector 19 in the stage 43, a resistor 59 connects the source 17 in the stage 43 to the collector 19 in the stage 44; and a resistor 59 connects the source 17 in the stage 44 to the collector 19 in the stage 41. Similarly, a 2.2 kilohm resistor 61 in each stage connects the source 17 to the emitter 21 in the preceding stage. Thus, the resistor 61 in the stage 44 connects the source 17 of this stage to the emitter 21 in the stage 43; the resistor 61 in the stage 43 connects the source 17 in this stage to the emitter 21 in the stage 42; the resistor 61 in the stage 42 connects the source 17 in this stage to the emitter 21 in the stage 41; and the resistor 61 in the stage 41 connects the source 17 in this stage to the emitter 21 in the stage 44.

Each of the stages 41, 42, 43 and 44 have two stable states. One stable state will be with the transistor 25 conducting the field-effect transistor 23 conducting. In this condition, the stage is referred to as being turned on. In the other stable state, the field-effect transistor 23 will be pinched off, and as a result, the junction transistor 25 will be cut off. In this stable state, the stage shall be referred to as being turned off. It shall be assumed for purposes of description that the stage 41 is turned on, and that the stages 42, 43 and 44 are turned off. In the stages which are turned off, the collectors 19 will be substantially at +10 volts. Similarly, the emitters of the stages which are turned off will be substantially at zero volts. The voltage at the sources 17 in each of the turned-off stages 42, 43 and 44 is determined by the voltage-dividing effect of the resistors 61 and 59. Thus, the voltage at each source 17 in the turned-off stages will be six-tenths of the difference between the voltage at the collector of the succeeding stage and the voltage at the emitter of the preceding stage. For example, the voltage at the emitter 21 of the stage 42 is zero volts, and the voltage at the collector 19 of the stage 44 is +10 volts. Thus, the voltage applied to the source 17 of the stage 43 will be six-tenths of +10 volts, or +6 volts. Since the voltage applied to the collector 19 of the stage 43 is +10 volts, the gate-to-source voltage of the field-effect transistor 23 will be +4 volts, which is sufficient to maintain this field-effect transistor pinched off and, in this manner, the stage 43 is maintained in its turned-off stable state. Since the stage 41 is turned on, the voltage at the collector 19 of the stage 41 will be considerably less than +10 volts due to the voltage drop through the resistor 47. As a result, the voltage applied to the source 17 of the stage 44 will even be less than +6 volts, and the gate-to-source voltage of the field-effect transistor 23 in the stage 44 will be even greater than +4 volts. Therefore, the stage 44 will also be maintained in its turned-off stable state. Since the stage 41 is turned on, the voltage at the emitter 21 of this stage will be considerably greater than zero, and thus the voltage applied at the source 17 of the stage 42 will be greater than +6 volts. The values of the resistors 59 and 61 are selected so that the voltage applied to the source 17 does not make the gate-to-source voltage of the field-effect transistor 23 in the stage 42 less than the pinch-off voltage. Thus, the field-effect transistor 23 will be maintained pinched-off, and the stage 42 will be maintained in its turned-off stable state. It will be noted, however, that the gate-to-source voltage of the field-effect transistor 23 in the stage 42 will be less than the gate-to-source voltage of the field-effect transistors 23 in the stages 43 and 44. The values of the resistors 59 and 61 are selected so that the gate-to-source voltage in the field-effect transistor 23 in the stage 42 is just greater than the pinch-off voltage for reasons which will be explained below. Since the field-effect transistor 23 in the stage 41 is conducting, the voltage applied to the source 17 of this stage will be considerably less than the +6 volts, since a large amount of the current flowing through the resistor 59 will flow into the source of the field-effect transistor 23. As pointed out above, since the stage 41 is conducting, there will be a large voltage drop through the resistor 47. This voltage drop will be sufficient to bring the voltage between the collector 19 and the source 17 in the stage considerably less than the pinch-off voltage of the field-effect transistor 23. The field-effect transistor 23 will therefore be maintained conducting, and the stage 41 will be maintained in its turned-on stable state.

When an input pulse is applied to the terminal 55, it will be applied through the capacitors 53 to the sources 17 in each stage. This will have the effect of raising the voltage at the source 17 in each stage and decreasing the gate-to-source voltage in each stage. Since the stage 41 is already turned on, it will not have any effect on this stage. The voltages at the sources 17 in the stages 43 and 44 will be sufficiently low that the input pulse will not raise the potential at the sources 17 in the stages 43 and 44 enough to bring the gate-to-source voltage of the field-effect transistors 23 in these stages below the pinch-off voltage. Therefore, the input pulse will not affect the stages 43 and 44. As pointed out above, the potential at the source 17 in the stage 42, however, is just above the pinch-off voltage, and when the input pulse is applied through the capacitor 53 to the source 17 in the stage 42, it will cause the voltage at the source 17 in this stage to rise sufficiently to bring the gate-to-source voltage of the field-effect transistor 23 in the stage 42 below the pinch-off voltage, and the field-effect transistor 23 in this stage will begin to conduct. When the field-effect transistor 23 in the stage 42 begins to conduct, it will cause current to flow into the base of the junction transistor 25 in this stage and, thus, the junction transistor 25 in stage 42 will begin to conduct. Current will start to flow through the resistor 47 in the stage 42, and this will cause the voltage at the collector 19 in the stage 42 to drop. This drop in voltage at the collector 19 further decreases the gate-to-source voltage of the field-effect transistor 23 in this stage, and thus more current flows through the field-effect transistor 23, allowing more current to flow into the base of the transistor 25. The effect is regenerative, and the field-effect transistor 23 and the junction transistor 25 will become fully conducting. In this manner, the stage 42 is turned on. The drop in voltage at the collector 19 is transmitted to the source 17 in the stage 42 by means of the resistor 59. When the voltage at the source 17 in the stage 41 drops, the gate-to-source voltage of the field-effect transistor 23 in the stage 41 increases. This increase in the gate-to-source voltage of the field-effect transistor 23 in this stage reduces the current flowing through this field-effect transistor, and thus reduces the current flowing through the junction transistor 25. This causes a rise in the potential at the collector 19 in the stage 41, and thus the gate-to-source potential of the field-effect transistor 23 in the stage 41 is further increased. Therefore, the current flowing through the field-effect transistor decreases further. The action in the stage 41 is regenerative, and the stage is turned off. Thus, after the pulse has been applied to the input 55, the stage 42 will be the stage which is turned on, and the stages 41, 43 and 44 will be turned off. Since each stage is identical and is connected with its adjacent stages in exactly the same manner, the stages 41, 43 and 44 will be maintained turned off in exactly the same manner that the stages 42, 43 and 44, respectively, were maintained turned off when the stage 41 was conducting. Similarly, the stage 42 will be maintained turned on in the same manner that the stage 41 was maintained turned on. The next pulse applied to the input 55 will cause the stage 43 to turn on which, in turn, will cause the stage 42 to turn off in the same manner that the stage 42 was turned on and the stage 41 was turned off. Each succeeding pulse will cause each succeeding stage to turn on, and the preceding stage to turn off in the same manner. The next pulse applied after the stage 44 has been turned on will cause the stage 41 to turn on again, and the stage 44 will be turned off. The device will operate in this manner continuously as long as pulses are applied to the input 55.

Figure 7:
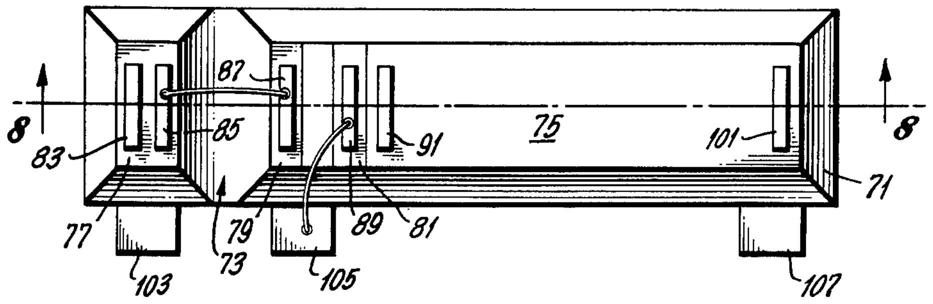
FIGURE 7 is a plan view of a preferred embodiment of the semiconductor network of the present invention.
Figure 8:
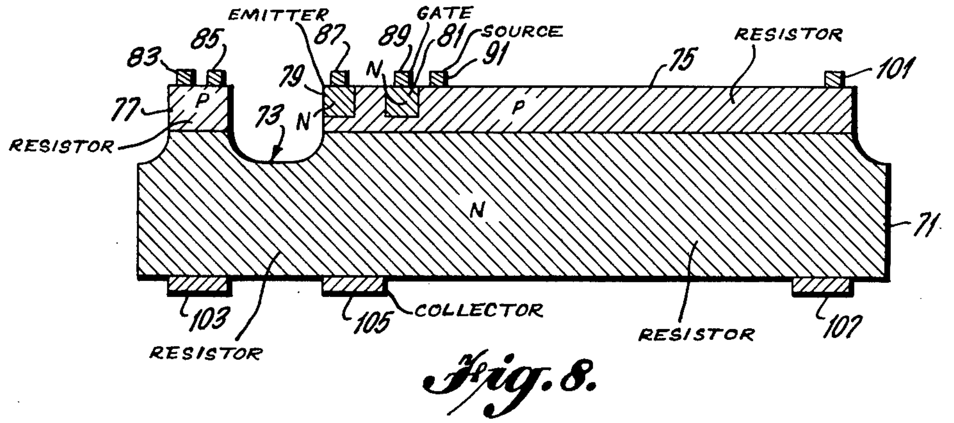
FIGURE 8 is a view in cross section of the semiconductor network of FIGURE 7.

FIGURES 7 and 8 illustrate the preferred embodiment of the semiconductor solid-state ring counter network. A solid-state network is provided for each stage of the ring counter. Since each stage of the ring counter is identical, each solid-state network providing the circuitry for each stage will be identical. FIGURES 7 and 8 illustrate the solid-state network for one of the stages of the ring counter. As shown in these figures, the solid-state network comprises an oblong block of N-type material 71 on which there is diffused a layer of P-type material. At one end of the oblong block, a slot 73 is cut through the layer of P-type material, dividing it into two parts 75 and 77, the part 75 being much longer along the oblong block 71 than the part 77. A section 79 of N-type material is formed by diffusion in the layer of P-type material at one end of the part 75. A second section 81 of N-type material is formed by diffusion in the P-type layer close to the section 79, leaving a short path of P-type material joining the two sections 79 and 81. The sections 79 and 81 are diffused to a depth not quite as far as the PN junction between the N-type material of block 71 and the P-type material of part 75. Evaporated aluminum contacts 83 and 85 are formed on the part 77 of the P-type layer at opposite sides thereof. An evaporated aluminum contact 87 is formed on the section 79 of N-type material. An evaporated aluminum contact 89 is formed on the section 81 of N-type material. An evaporated aluminum contact 91 is formed on the part 75 of the P-type layer close to the section 81 and on the opposite side thereof from the section 79. A second evaporated aluminum contact 101 is also formed on part 75 of the P-type layer at the opposite end from the sections 79 and 81. The aluminum contacts 83, 85, 91 and 101 make ohmic conatct with the layer of P-type material and the contacts 87 and 89 make ohmic contact with the sections of 79 and 81, respectively. Ohmic contacts in the form of tabs 103, 105 and 107 are formed on the block of N-type material on the opposite side from the layer of P-type material made up of the parts 75 and 77. The ohmic contact 103 is formed directly below the part 77 of the P-type layer. The ohmic contact 105 is formed directly below the section 79 of N-type material, and the ohmic contact 107 is formed at the opposite end of the block 71 of N-type material beneath the aluminum contact 101. The semiconductor network shown in FIGURES 7 and 8 can be fabricated by the same techniques described for the fabrication of the bipolar field-effect transistor shown in FIGURES 2*b* and 2*c*.

The above-described device shown in FIGURES 7 and 8 can be used to provide almost the entire circuitry for a single stage of the ring counter. In order to use this device for the circuitry of a single stage, the contact 85 must be connected directly to the contact 87. The capacitor 53 of each stage is not provided in the solid-state network, and must be connected externally. This capacitor will be connected to the contact 91. When this solid-state network is used in the ring counter, the contact 83 will be grounded and +10 volts will be applied to the terminal 103. With the block connected in this manner, the complete circuitry for a single stage of the ring counter is provided. The resistance of the conducting path through the part 77 of the P-type layer between the contacts 83 and 85 provides the resistance 51 for the stage. The resistance of the path through the part 75 of the P-type layer between the contacts 91 and 101 provides the resistor 61. The resistance of the path through the N-type semiconductor material of the block 71 between the contacts 105 and 107 provides the resistor 59. The resistance of the path between the contacts 103 and 105 through the N-type material of the block 71 provides the resistor 47. The sections 79 and 81, the PN junction between the layer of P-type material and the block 71 of N-type material beneath these sections, and the contacts 87, 89, 91 and 105 with the contacts 89 and 105 connected together provide the bipolar field-effect transistor, the contact 91 providing the source of the bipolar field-effect transistor, the common connection to the contacts 89 and 105 providing the collector of the bipolar transistor, and the contact 87 providing the emitter of the bipolar field-effect transistor.

Thus, to connect a plurality of these stages formed out of semiconductor networks as disclosed in FIGURES 6 and 7, the contact 101 of each succeeding stage should be connected to the contact 87 of the preceding stage and the contact 91 of each preceding stage should be connected to the contact 107 of the succeeding stage. The unconnected terminals of the capacitors 53 connected to the contacts 91, of course, will be connected together to the input terminal 55 and through the resistor 57 to ground as shown in FIGURE 6. In this manner, the ring counter is provided with solid-state networks.

The above description is of a preferred embodiment of the invention, and many modifications may be made thereto without departing from the spirit and scope of the invention which is limited only as defined in the appended claims.

What is claimed is:

1. A semiconductor network comprising a wafer of single crystal semiconductor material, a first region of one conductivity-type defined in said wafer, a second region of the opposite conductivity-type defined in said wafer adjacent the surface thereof and contiguous to said first region, a third region and a fourth region of said one conductivity-type defined in said wafer adjacent the surface thereof and continguous to said second region, said third and fourth regions being spaced from said first region by less than a diffusion length and from one another by much more than a diffusion length, the portion of said second region between said first and third regions forming the channel of a unipolar transistor and the portion of said second region between said first and fourth regions forming the base of a bipolar transistor, first conductive means contacting said second region closely adjacent said third region, said first conductive means being connected to said base within said second region of said wafer only by said channel, second conductive means contacting said second region at a position spaced from said third region by a distance substantially greater than the spacing between said third region and said first conductive means whereby a first resistor is provided between said first and second conductive means, third conductive means contacting said first region closely adjacent said base, fourth conductive means contacting said first region at a position spaced from said third conductive means by a distance substantially greater than the spacing from said base to said third conductive means whereby a second resistor is provided between said third and fourth conductive means, fifth conductive means contacting said first region at a position spaced from said third conductive means by a distance substantially greater than the spacing from said base to said third conductive means whereby a third resistor is provided between said third and fifth conductive means, means for connecting a voltage source between said fourth conductive means and said fourth region, means for connecting said third region to said third conductive means, means for applying input signals to said first conductive means, means for applying biasing potentials to said second conductive means, and means for deriving output signals from said fifth conductive means.

2. A semiconductor network comprising a wafer of single crystal semiconductor material, a first region of one conductivity-type defined in said wafer, a second region of the opposite conductivity-type defined in said wafer adjacent the surface thereof and contiguous to said first region, a third region and a fourth region of said one conductivity-type defined in said wafer adjacent the surface thereof and contiguous to said second region, said third and fourth regions being spaced from said first region and from one another, first conductive means contacting said second region closely adjacent said third region, said first conductive means being connected to that portion of said second region adjacent said fourth region only by a thin channel underlying said third region, second conductive means contacting said second region at a position spaced from said third region by a distance substantially greater than the spacing between said third region and said first conductive means, third conductive means contacting said first region closely adjacent that portion of said second region which is adjacent said fourth region, fourth conductive means contacting said first region at a position spaced from said third conductive means by a distance substantially greater than the spacing from that portion of said second region which is adjacent said fourth region to said third conductive means, and fifth conductive means contacting said first region at a position spaced from said third conductive means by a distance substantially greater than the spacing from that portion of said second region which is adjacent said fourth region to said third conductive means.

3. A semiconductor network comprising a wafer of single crystal semiconductor material, a first region of one conductivity-type defined in said wafer, a second region of the opposite conductivity-type defined in said wafer adjacent the surface thereof and contiguous to said first region, a third region and a fourth region of said one conductivity-type defined in said wafer adjacent the surface thereof and contiguous to said second region, said third and fourth regions being spaced from said first region and from one another, the portion of said second region between said first and fourth region being the base of a bipolar transistor, first conductive means contacting said second region closely adjacent said third region, said first conductive means being connected to said base within said second region of said wafer only by a thin portion underlying said third region which provides the channel of a unipolar transistor, second conductive means contacting said second region at a position spaced from said third region by a distance substantially greater than the spacing between said third region and said first conductive means whereby a first resistor is provided between said first and second conductive means, third conductive means contacting said first region closely adjacent said base, and fourth conductive means contacting said first region at a position spaced from said third conductive means by a distance substantially greater than the spacing from said base to said third conductive means whereby a second resistor is provided between said third and fourth conductive means.

4. A semiconductor integrated circuit device comprising:

(a) a body monocrystalline semiconductor material;

(b) a bipolar field-effect transistor formed in the body near a major face thereof by alternate layers of semiconductor material of opposite conductivity types, said transistor including base, emitter and collector regions and gate and channel regions with the channel region being electrically connected at one end to the base region and the gate region being electrically connected to the collector region;

(c) a plurality of elongated regions of semiconductor material defined in the body to provide resistors, at least two of the elongated regions being formed by shallow diffused portions of the body which are of conductivity type opposite to that immediately underlying such elongated regions;

(d) means electrically connecting the ends of particular ones of said elongated regions separately to the collector and emitter regions and to the other end of the channel region of the field-effect transistor;

(e) and means including the elongated regions for supplying operating bias to the transistor whereby distinct two-state operation is provided.

References Cited by the Examiner

UNITED STATES PATENTS

| | | | |
|---|---|---|---|
| 2,663,806 | 12/1953 | Darlington | 317—234 |
| 2,666,814 | 1/1954 | Shockley | 307—88.5 |
| 2,987,659 | 6/1961 | Teszner | 317—235 |
| 3,029,366 | 4/1962 | Lehovec | 317—234 |
| 3,061,729 | 10/1962 | Stone et al. | 317—235 |

FOREIGN PATENTS

| | | | |
|---|---|---|---|
| 593,615 | 3/1960 | Canada. | |

ARTHUR GAUSS, *Primary Examiner.*